(12) United States Patent
Liang et al.

(10) Patent No.: US 11,486,778 B2
(45) Date of Patent: Nov. 1, 2022

(54) TORQUE-ANGLE SENSOR FOR MONITORING A STEERING SITUATION OF A VEHICLE

(71) Applicant: Robert Bosch GmbH, Stuttgart (DE)

(72) Inventors: Gaofeng Liang, Jiangsu (CN); Mirko Scheer, Jiangsu (CN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/113,580

(22) Filed: Dec. 7, 2020

(65) Prior Publication Data

US 2021/0190611 A1 Jun. 24, 2021

(30) Foreign Application Priority Data

Dec. 18, 2019 (CN) .................. 201922275720.X

(51) Int. Cl.
| | |
|---|---|
| *G01L 5/22* | (2006.01) |
| *B62D 15/02* | (2006.01) |
| *H05K 1/16* | (2006.01) |
| *G01B 7/30* | (2006.01) |
| *B62D 6/10* | (2006.01) |
| *G01L 3/10* | (2006.01) |

(52) U.S. Cl.
CPC .............. *G01L 5/221* (2013.01); *B62D 6/10* (2013.01); *B62D 15/0215* (2013.01); *G01B 7/30* (2013.01); *G01L 3/105* (2013.01); *H05K 1/165* (2013.01)

(58) Field of Classification Search
CPC .......... G01L 5/221; G01L 3/105; B62D 6/10; B62D 15/0215; G01B 7/30; H05K 1/165
USPC ................................................... 73/862.331
See application file for complete search history.

(56) References Cited

FOREIGN PATENT DOCUMENTS

| | | | |
|---|---|---|---|
| CN | 106197255 | * | 12/2016 |
| CN | 205940448 | * | 2/2017 |
| CN | 212721465 | * | 3/2021 |
| DE | 102020213525 | * | 7/2021 |

* cited by examiner

*Primary Examiner* — Octavia Davis Hollington
(74) *Attorney, Agent, or Firm* — Maginot, Moore & Beck LLP

(57) ABSTRACT

A torque-angle sensor includes a torque sensing unit, an angle sensing unit, and a PCB. The torque sensing unit includes a signal input rotor and a signal output rotor. The angle sensing unit includes a driving gear and a driven gear that is fitted round and fixed to one of the signal rotors. The PCB has a torque magnetic field generating unit, an input shaft signal collecting unit, and an output shaft signal collecting unit that sense a rotation angle and torque of the signal rotors. The PCB has an angle magnetic field generating unit and an angle collecting unit that sense a rotation angle of the driving gear and the driven gear. The torque magnetic field generating unit, the input shaft signal collecting unit, the output shaft signal collecting unit, the angle magnetic field generating unit, and the angle collecting unit are configured as coils formed by printed circuits.

12 Claims, 2 Drawing Sheets

TORQUE-ANGLE SENSOR FOR MONITORING A STEERING SITUATION OF A VEHICLE

This application claims priority under 35 U.S.C. § 119 to patent application no. CN 201922275720.X, filed on Dec. 18, 2019 in China, the disclosure of which is incorporated herein by reference in its entirety.

FIELD

The disclosure relates to a sensor and, more specifically, an integrated torque-angle sensor configured to monitor a steering situation of a vehicle.

BACKGROUND

A torque-angle sensor integrates and combines a torque sensor and an angle sensor, and is used to measure the angle of rotation of a vehicle steering wheel and the size of the torque to which the vehicle steering wheel is subjected. An existing torque-angle sensor has a torque measurement module, an angle measurement module, a circuit board and a housing. Elements such as a Hall sensing element and an electromagnetic sensing element are provided on the circuit board, for sensing torque and angle signals.

SUMMARY

In view of the above, the disclosure provides a torque-angle sensor, with a small number of elements.

First of all, according to one aspect of the disclosure, it provides a torque-angle sensor, configured to detect a steering torque and angle of steering wheel steering of a vehicle, the torque-angle sensor comprising a torque sensing unit, an angle sensing unit and a printed circuit board (PCB), the torque sensing unit comprising a signal input rotor and a signal output rotor, the angle sensing unit comprising a driving gear and a driven gear, the driving gear being fitted round and fixed to the signal output rotor or signal input rotor, the PCB being provided with a torque magnetic field generating unit, an input shaft signal collecting unit and an output shaft signal collecting unit, for sensing a rotation angle and torque of the signal input rotor and signal output rotor, and the PCB being further provided with an angle magnetic field generating unit and an angle collecting unit, for sensing a rotation angle of the driving gear and driven gear; the torque magnetic field generating unit, input shaft signal collecting unit, output shaft signal collecting unit, angle magnetic field generating unit and angle collecting unit are all realized in the form of coils formed by printed circuits.

According to a feasible embodiment, the signal input rotor comprises a cylindrical first body, and a number of first protruding teeth arranged to extend uniformly in radial directions from an outer circumference of the first body, each first protruding tooth having substantially the same shape, and the signal output rotor comprises a cylindrical second body, and a number of second protruding teeth arranged to extend uniformly in radial directions from an outer circumference of the second body, each second protruding tooth having substantially the same shape.

According to a feasible embodiment, the driving gear is fitted round and fixed to the second body of the signal output rotor or the first body of the signal input rotor, and meshed with the driven gear; and the axes of the driving gear and the driven gear are parallel.

According to a feasible embodiment, a conductive plate is fixed to the driven gear.

According to a feasible embodiment, the angle magnetic field generating unit and angle collecting unit are formed on the PCB according to a certain winding pattern, and arranged coaxially in an encircling manner in the form of circular rings; and the axis of the angle collecting unit corresponds to the axis of the driven gear.

According to a feasible embodiment, the angle magnetic field generating unit coaxially surrounds the angle collecting unit.

According to a feasible embodiment, the torque magnetic field generating unit is an excitation coil, the input shaft signal collecting unit is an input shaft receiving coil, and the output shaft signal collecting unit is an output shaft receiving coil.

According to a feasible embodiment, the inner and outer diameters of the input shaft signal collecting unit and output shaft signal collecting unit substantially correspond to the inner and outer diameters of the first protruding teeth and second protruding teeth respectively.

According to a feasible embodiment, the torque magnetic field generating unit comprises only one torque magnetic field generating unit, which is shared by the input shaft signal collecting unit and the output shaft signal collecting unit.

According to a feasible embodiment, the torque magnetic field generating unit comprises a first torque magnetic field generating unit and a second torque magnetic field generating unit, wherein the first torque magnetic field generating unit is an input shaft excitation coil, and is arranged on a surface of the PCB with the input shaft signal collecting unit, facing the signal input rotor; the second torque magnetic field generating unit is an output shaft excitation coil, and is arranged on another surface of the PCB with the output shaft signal collecting unit, facing the signal output rotor.

According to a feasible embodiment, the outer diameters of the first protruding teeth and second protruding teeth are substantially equal, and the first protruding teeth and second protruding teeth are respectively located at different sides of the PCB.

According to a feasible embodiment, the first torque magnetic field generating unit is coaxially located outside the input shaft signal collecting unit, and the second torque magnetic field generating unit is coaxially located outside the output shaft signal collecting unit.

Compared with the prior art, the angle magnetic field generating unit, angle collecting unit, torque magnetic field generating unit, input shaft signal collecting unit and output shaft signal collecting unit on the PCB of the sensor of the disclosure are all realized in the form of coils formed by printed circuits; the Hall sensing elements and electromagnetic sensing elements in the prior art are omitted, thus the number of elements of the torque-angle sensor of the disclosure are reduced, thereby reducing costs, simplifying the product structure, and increasing the production efficiency.

BRIEF DESCRIPTION OF THE DRAWINGS

A more comprehensive understanding of the abovementioned and other aspects of the disclosure will be gained from the following detailed description which refers to the drawings. The drawings comprise.

DETAILED DESCRIPTION

The disclosure is described in detail below by means of demonstrative embodiments.

Some exemplary embodiments of the disclosure are described in greater detail below with reference to the drawings, in order to better understand the basic idea and advantages of the disclosure.

Figure 1:
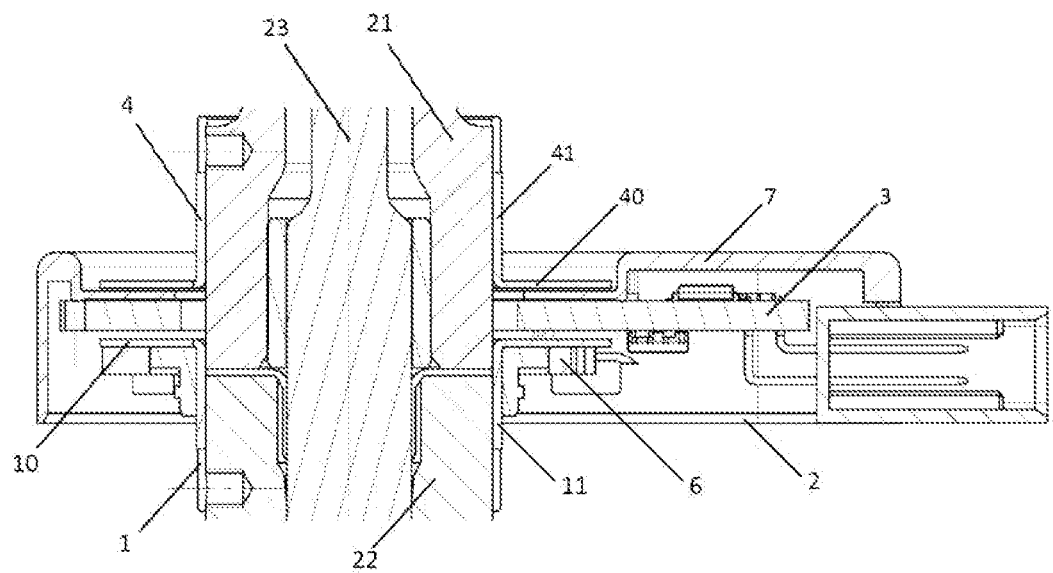
FIG. 1 shows a schematic sectional view of a torque-angle sensor configured to detect a steering torque and angle of steering wheel rotation.
Figure 2:
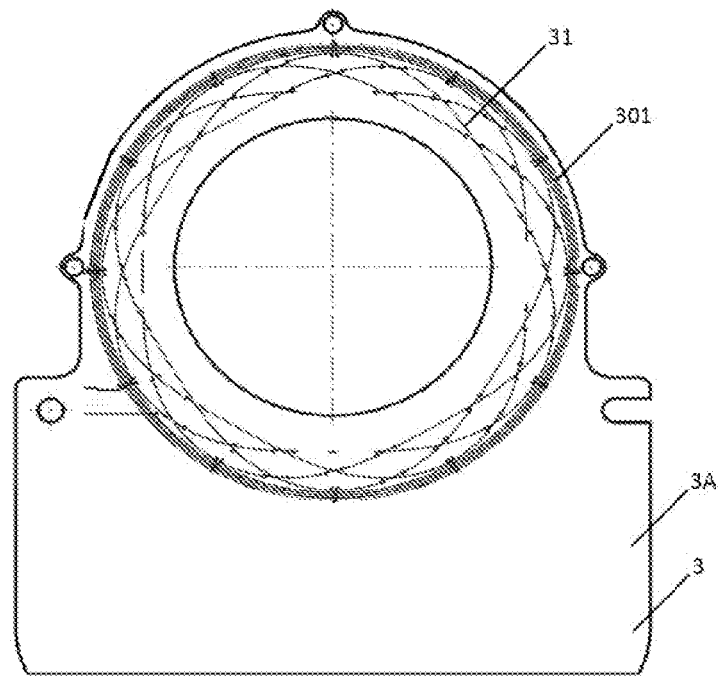
FIG. 2 shows a schematic three-dimensional assembled drawing of a vehicle steering column and the torque-angle sensor shown in FIG. 1.
Figure 3:
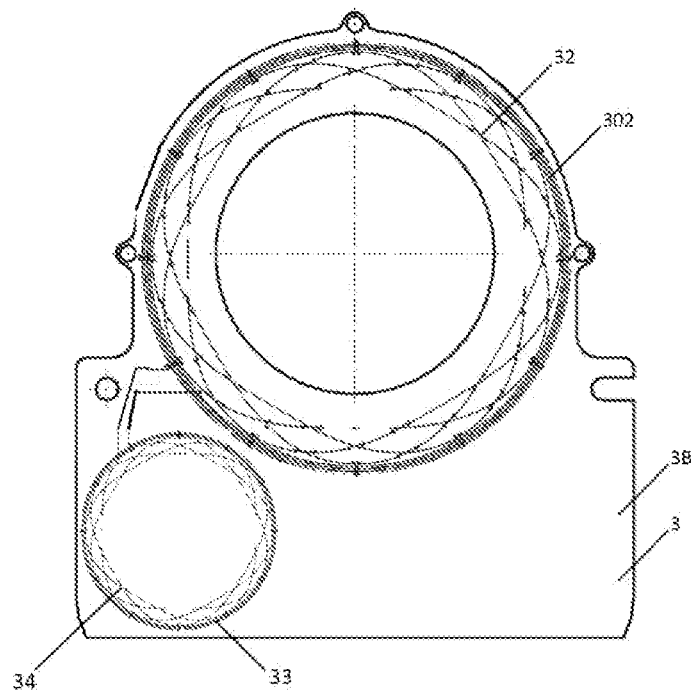
FIG. 3 shows a schematic three-dimensional exploded drawing of FIG. 2, in which an input shaft and torsion bar of the vehicle steering column are not shown.
Figure 4:
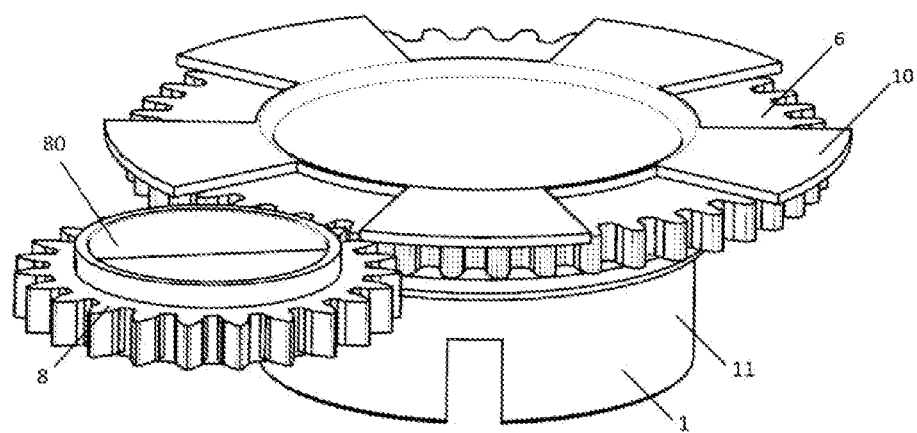
FIG. 4 shows a schematic sectional view of FIG. 2.

Referring to FIGS. 1-4, a steering column of a vehicle comprises an input shaft 21 from a steering wheel (not shown), an output shaft 22 to a steering shaft connector (not shown), and a torsion bar 23 connected between the input shaft 21 and the output shaft 22. When the steering wheel is subjected to a force, the torsion bar 23 experiences deformation; using known mechanical characteristics of the material of the torsion bar 23, a steering torque of steering wheel steering can be determined on the basis of a relative rotation angle of the input shaft 21 relative to the output shaft 22, and this relative rotation angle can characterize the torsional deformation of the torsion bar 23.

A torque-angle sensor in an embodiment of the disclosure is configured to detect a steering torque and angle of vehicle steering wheel rotation; the torque-angle sensor comprises a torque sensing unit, an angle sensing unit and a PCB 3.

The torque-angle sensor further comprises a top cover 7 and a sensor case 2; a receiving space is formed therebetween, for the purpose of receiving the angle sensing unit and PCB 3.

The torque sensing unit comprises a signal input rotor 4 and a signal output rotor 1. The signal input rotor 4 comprises a cylindrical first body 41, and a number of first protruding teeth 40 arranged to extend uniformly in radial directions from an outer circumference of the first body 41; a first empty part is provided between the first protruding teeth 40, and each first protruding tooth 40 has substantially the same shape. The signal output rotor 1 comprises a cylindrical second body 11, and a number of second protruding teeth 10 arranged to extend uniformly in radial directions from an outer circumference of the second body 11; a second empty part is provided between the second protruding teeth 10, and each second protruding tooth 10 has substantially the same shape. The signal input rotor 4 and signal output rotor 1 are respectively configured to be arranged on mutually opposite ends of the input shaft 21 and output shaft 20; specifically, the first body 41 of the signal input rotor 4 is fitted round the input shaft 21 and rotates coaxially with the input shaft 21, and the second body 11 of the signal output rotor 1 is fitted round the output shaft 22 and rotates coaxially with the output shaft 22, such that a torque between the input shaft 21 and output shaft 22 can be converted to a torque between the signal input rotor 4 and signal output rotor 1; the torque of steering wheel steering can be measured by measuring the torque between the signal input rotor 4 and signal output rotor 1. In this embodiment, the outer diameters of the first protruding teeth 40 and second protruding teeth 10 are substantially equal, and the first protruding teeth 40 and second protruding teeth 10 are respectively located at different sides of the PCB 3.

In this embodiment, the PCB 3 is fitted round the input shaft 21; the PCB 3 comprises a torque magnetic field generating unit, an input shaft signal collecting unit 31 and an output shaft signal collecting unit 32, for sensing a rotation angle and torque of the signal input rotor 4 and signal output rotor 1. In this embodiment, the torque magnetic field generating unit comprises a first torque magnetic field generating unit 301 and a second torque magnetic field generating unit 302. The first torque magnetic field generating unit 301 and the input shaft signal collecting unit 31 are arranged on a surface 3A of the PCB 3, facing the signal input rotor 4; the second torque magnetic field generating unit 302 and the output shaft signal collecting unit 32 are arranged on another surface 3B of the PCB 3, facing the signal output rotor 1. That is to say: the first torque magnetic field generating unit 301 and the input shaft signal collecting unit 31 are located on a different surface of the PCB 3 from that on which the second torque magnetic field generating unit 302 and the output shaft signal collecting unit 32 are located. The first and second torque magnetic field generating units 301, 302, the input shaft signal collecting unit 31 and the output shaft signal collecting unit 32 are all realized as coils formed by printed circuits, and coaxially encircle the steering column of the steering wheel. For example: the first torque magnetic field generating unit 301 is an input shaft excitation coil, the input shaft signal collecting unit 31 is an input shaft receiving coil, the second torque magnetic field generating unit 302 is an output shaft excitation coil, and the output shaft signal collecting unit 32 is an output shaft receiving coil. The first and second torque magnetic field generating units 301, 302, the input shaft signal collecting unit 31 and the output shaft signal collecting unit 32 are formed by winding according to a certain winding pattern, and are substantially arranged in the form of concentric circular rings; the numbers of turns and winding patterns thereof are determined according to actual demands and parameters. The first torque magnetic field generating unit 301 is coaxially located outside the input shaft signal collecting unit 31, and the second torque magnetic field generating unit 302 is coaxially located outside the output shaft signal collecting unit 32. The inner and outer diameters of the input shaft signal collecting unit 31 and output shaft signal collecting unit 32 substantially correspond to the inner and outer diameters of the first protruding teeth 40 and second protruding teeth 10 respectively.

In another embodiment, the first protruding teeth 40 and second protruding teeth 10 are located at the same side of the PCB 3, and the first protruding teeth 40 have a greater inner diameter than the outer diameter of the second protruding teeth 10 and surround the second protruding teeth 10; therefore, the first and second torque magnetic field generating units 301, 302, the input shaft signal collecting unit 31 and the output shaft signal collecting unit 32 are all arranged on the same surface of the PCB 3, the input shaft signal collecting unit 31 surrounds the output shaft signal collecting unit 32 and these respectively correspond to the positions of the first protruding teeth 40 and second protruding teeth 10; the torque magnetic field generating unit may comprise only one torque magnetic field generating unit, which is shared by the input shaft signal collecting unit 31 and the output shaft signal collecting unit 32.

When the signal input rotor 4 and signal output rotor 1 rotate, the first protruding teeth 40 of the signal input rotor 4 and the second protruding teeth 10 of the signal output rotor 1 cut the magnetic fields generated by the first and second torque magnetic field generating units 301, 302 respectively; the input shaft signal collecting unit 31 and output shaft signal collecting unit 32 on the PCB 3 sense the rotation angles of the first protruding teeth 40 of the signal input rotor 4 and the second protruding teeth 10 of the signal output rotor 1 respectively by the principle of electromagnetic induction, and these are multiplied by a torsion bar coefficient, to obtain two crossed torque and angle signals. The PCB 3 may also sense angle signals of the signal input rotor 4 and signal output rotor 1 in another conventional manner, e.g. by resistance strain sensing, inductive sensing, capacitive sensing, piezoelectric sensing, optoelectronic sensing or Hall sensing.

The angle sensing unit comprises a driving gear 6 and a driven gear 8, wherein a conductive plate 80 is fixed to the driven gear 8; the driving gear 6 is fitted round and fixed to the signal output rotor 1, and meshed with the driven gear 8; and the axes of the driving gear 6 and the driven gear 8 are parallel. Specifically, the driving gear 6 is fitted round and fixed to the second body 11 of the signal output rotor 1; the signal output rotor 1 and driving gear 6 may be fixed together by a connection method such as welding, insert injection moulding or pressing in. As will be understood, depending on actual demands, the driving gear 6 may also be fitted round the signal input rotor 4 in a fixed manner The PCB 3 further comprises an angle magnetic field generating unit 33 and an angle collecting unit 34, for sensing a rotation angle of the driving gear 6 and driven gear 8. The angle magnetic field generating unit 33 and angle collecting unit 34 are both realized as coils formed by printed circuits, being formed on the PCB 3 according to a certain winding pattern, and arranged coaxially in an encircling manner in the form of circular rings, with the angle magnetic field generating unit 33 coaxially surrounding the angle collecting unit 34. The axis of the angle collecting unit 34 corresponds to the axis of the driven gear 8, for the purpose of detecting a rotation angle of the driven gear 8. When the rotation angle of the input/output shaft is greater than 360 degrees, and the driving gear 6 drives the driven gear 8, the angle collecting unit 34 will perceive and calculate the position of the conductive plate 80 on the driven gear 8 and output a number-of-turns following signal to an ECU control unit; this signal and an initial rotation angle signal measured by the input shaft signal collecting unit 31 and output shaft signal collecting unit 32 are coupled via a Nonius algorithm inside the ECU to calculate the final required precise angle signal. For example, in this embodiment, the driving gear 6 is mounted in a fixed manner to the signal output rotor 1; a cycle angle of the driving gear 6 is 360/N, and measured by the output shaft signal collecting unit 32 surrounding the steering column of the steering wheel, wherein N is the number of protruding teeth of the signal output rotor 1, and a cycle angle of the driven gear 8 is (360/Z1)*Z2, and measured by the angle collecting unit 34, wherein Z1 is the number of teeth on the driving gear 6, and Z2 is the number of teeth on the driven gear 8; a Nonius algorithm is used to calculate the lowest common multiple of (360/N, (360/Z1)*Z2) to obtain the absolute angle of the rotation angle driving gear, e.g. when Z1=45, Z2=13 and N=12, then the lowest common multiple of (360/N, (360/Z1)*Z2) is 1560, i.e. the measured angle range is 1560 degrees. When the driving gear 6 is mounted in a fixed manner on the signal input rotor 4, the cycle angle of the driving gear 6 is 360/N, and measured by the input shaft signal collecting unit 31 surrounding the steering column of the steering wheel, wherein N is the number of protruding teeth of the signal input rotor 4.

The angle magnetic field generating unit, angle collecting unit, torque magnetic field generating unit, input shaft signal collecting unit and output shaft signal collecting unit on the PCB of the sensor of the disclosure are all realized in the form of coils formed by printed circuits; the Hall sensing elements and electromagnetic sensing elements in the prior art are omitted, thus the number of elements of the torque-angle sensor of the disclosure are reduced, thereby reducing costs, simplifying the product structure, and increasing the production efficiency.

Although the disclosure has been explained and described here with reference to specific embodiments, the disclosure is not limited to the details shown. Various amendments could be made to these details within the scope of the disclosure.

What is claimed is:

1. A torque-angle sensor configured to detect a steering torque and angle of steering wheel steering of a vehicle, comprising:
   a torque sensing unit that includes a signal input rotor and a signal output rotor;
   an angle sensing unit that includes a driving gear and a driven gear, the driving gear fitted round and fixed to the signal output rotor or the signal input rotor; and
   a printed circuit board (PCB) that includes:
      a torque magnetic field generating unit, an input shaft signal collecting unit, and an output shaft signal collecting unit that are configured to sense a rotation angle and torque of the signal input rotor and the signal output rotor, and
      an angle magnetic field generating unit and an angle collecting unit that are configured to sense a rotation angle of the driving gear and the driven gear,
   wherein the torque magnetic field generating unit, the input shaft signal collecting unit, the output shaft signal collecting unit, the angle magnetic field generating unit, and the angle collecting unit are all configured as coils formed by printed circuits.

2. The torque-angle sensor according to claim 1, wherein the signal input rotor comprises a cylindrical first body and a number of first protruding teeth arranged to extend uniformly in radial directions from an outer circumference of the first body, each first protruding tooth having substantially the same shape, and wherein the signal output rotor comprises a cylindrical second body and a number of second protruding teeth arranged to extend uniformly in radial directions from an outer circumference of the second body, each second protruding tooth having substantially the same shape.

3. The torque-angle sensor according to claim 2, wherein the driving gear is fitted round and fixed to the second body of the signal output rotor or the first body of the signal input rotor, and meshed with the driven gear, and wherein the axes of the driving gear and the driven gear are parallel.

4. The torque-angle sensor according to claim 3, wherein a conductive plate is fixed to the driven gear.

5. The torque-angle sensor according to claim 4, wherein the angle magnetic field generating unit and the angle collecting unit are formed on the PCB according to a certain winding pattern, and arranged coaxially in an encircling manner in the form of circular rings, and wherein the axis of the angle collecting unit corresponds to the axis of the driven gear.

6. The torque-angle sensor according to claim 5, wherein the angle magnetic field generating unit coaxially surrounds the angle collecting unit.

7. The torque-angle sensor according to claim 2, wherein the torque magnetic field generating unit is an excitation coil, the input shaft signal collecting unit is an input shaft receiving coil, and the output shaft signal collecting unit is an output shaft receiving coil.

8. The torque-angle sensor according to claim 7, wherein inner and outer diameters of the input shaft signal collecting unit and the output shaft signal collecting unit substantially correspond to inner and outer diameters of the first protruding teeth and the second protruding teeth, respectively.

9. The torque-angle sensor according to claim 8, wherein the torque magnetic field generating unit comprises only one torque magnetic field generating unit, which is shared by the input shaft signal collecting unit and the output shaft signal collecting unit.

10. The torque-angle sensor according to claim 8, wherein:
the torque magnetic field generating unit comprises a first torque magnetic field generating unit and a second torque magnetic field generating unit,
the first torque magnetic field generating unit is an input shaft excitation coil, and is arranged on a surface of the PCB with the input shaft signal collecting unit, facing the signal input rotor, and
the second torque magnetic field generating unit is an output shaft excitation coil, and is arranged on another surface of the PCB with the output shaft signal collecting unit, facing the signal output rotor.

11. The torque-angle sensor according to claim 10, wherein the outer diameters of the first protruding teeth and the second protruding teeth are substantially equal, and wherein the first protruding teeth and the second protruding teeth are respectively located at different sides of the PCB.

12. The torque-angle sensor according to claim 10, wherein the first torque magnetic field generating unit is coaxially located outside the input shaft signal collecting unit, and wherein the second torque magnetic field generating unit is coaxially located outside the output shaft signal collecting unit.

* * * * *